(12) United States Patent
Lim et al.

(10) Patent No.: US 7,755,151 B2
(45) Date of Patent: Jul. 13, 2010

(54) WAFER LEVEL PACKAGE FOR SURFACE ACOUSTIC WAVE DEVICE AND FABRICATION METHOD THEREOF

(75) Inventors: Ji-hyuk Lim, Suwon-si (KR); Jun-sik Hwang, Yongin-si (KR); Woon-bae Kim, Suwon-si (KR); Suk-jin Ham, Seoul (KR); Jong-oh Kwon, Suwon-si (KR); Moon-chul Lee, Yongin-si (KR); Chang-youl Moon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 454 days.

(21) Appl. No.: 11/415,099

(22) Filed: May 2, 2006

(65) Prior Publication Data

US 2007/0096227 A1    May 3, 2007

(30) Foreign Application Priority Data

Oct. 31, 2005    (KR) ...................... 10-2005-0103404

(51) Int. Cl.
 *H01L 29/82* (2006.01)
 *H01L 23/04* (2006.01)
 *H01L 21/00* (2006.01)
(52) U.S. Cl. ............... 257/416; 257/698; 257/E23.011; 257/E23.151; 438/50
(58) Field of Classification Search ................. 257/416, 257/690, 698, 704, 678, 709, 729, 773, 774, 257/E23.174, E23.011, E23.136, E23.145, 257/E23.151, E23.155, 692
See application file for complete search history.

(56) References Cited

U.S. PATENT DOCUMENTS

| | | | | |
|---|---|---|---|---|
| 4,639,631 A | * | 1/1987 | Chason et al. | 310/344 |
| 5,828,126 A | * | 10/1998 | Thomas | 257/695 |
| 6,114,635 A | * | 9/2000 | Lakin et al. | 174/260 |
| 6,495,398 B1 | * | 12/2002 | Goetz | 438/117 |
| 6,852,561 B2 | * | 2/2005 | Bidard et al. | 438/50 |
| 2004/0106294 A1 | * | 6/2004 | Lee et al. | 438/691 |
| 2004/0207033 A1 | * | 10/2004 | Koshido | 257/415 |
| 2004/0209387 A1 | * | 10/2004 | Hong | 438/27 |
| 2005/0067681 A1 | * | 3/2005 | De Villeneuve et al. | 257/678 |
| 2005/0073040 A1 | * | 4/2005 | Lee et al. | 257/698 |

FOREIGN PATENT DOCUMENTS

| | | |
|---|---|---|
| EP | 0 609 062 A1 | 8/1994 |
| EP | 1 432 123 A2 | 6/2004 |
| JP | 2003-110391 A | 4/2003 |
| WO | 2004/044980 A2 | 5/2004 |

* cited by examiner

*Primary Examiner*—Wael Fahmy
*Assistant Examiner*—Sarah K Salerno
(74) *Attorney, Agent, or Firm*—Sughrue Mion, PLLC

(57) ABSTRACT

A wafer level package for a surface acoustic wave device and a fabrication method thereof include a SAW device formed with a SAW element on an upper surface of a device wafer; a cap wafer joined on an upper part of the SAW element; a cavity part housing the SAW element between the cap wafer and the SAW device; a cap pad formed on an upper surface of the cap wafer; and a metal line formed to penetrate through the cap wafer to electrically connect the cap pad and the SAW element, the device wafer and the cap wafer being made of the same materials.

11 Claims, 5 Drawing Sheets

WAFER LEVEL PACKAGE FOR SURFACE ACOUSTIC WAVE DEVICE AND FABRICATION METHOD THEREOF

CROSS-REFERENCE TO RELATED APPLICATIONS

This application claims benefit under 35 U.S.C. §119(a) of Korean Patent Application No. 2005-0103404, filed Oct. 31, 2005, in the Korean Intellectual Property Office, the entire contents of which are incorporated herein by reference.

BACKGROUND OF THE INVENTION

1. Field of the Invention

The present invention relates to a wafer level package for a SAW (surface acoustic wave) device and a fabrication method thereof.

2. Description of the Related Art

A surface acoustic wave (hereinafter, referred to as SAW) device is used as an electronic part for filters, delay lines and oscillators in an electronic device which transmits and receives a signal waveforms , and is widely used in the radio-frequency area for cellular phones, in order to filter unnecessary signals. There is a premium on compactness and enhanced-performance devices, as well as downward pressure on manufacturing cost.

A structure of a filtering device [SAW filter 10] manufactured by use of the SAW device in the prior art will be described through FIG. 1A and 1B. As described, the SAW filter 10 includes a ceramics package 11, a cavity part 12 formed by the walls inside of the package 11, a metal cap 13 sealing an opening of the cavity part 12 and a SAW element 14 embedded in the cavity part 12. As illustrated in FIG 1B, the package 11 is 3-layered structure where 3 substrates 11a, 11b, and 11c are joined, and formed with an electrode pad 15, a wiring pattern 16 and a foot pattern 17, respectively. The SAW element 14 is fixed on a bottom of the cavity part 12, with the surface with an InterDigital Transducer (hereinafter, referred to as IDT) on it put faceup. The SAW element 14 is electrically connected to the wiring pattern 15 exposed internally into the cavity part 12 by the metal wire 18. The metal cap 13 is fixed on a upper surface of the package 11 by a binding material 19 such as a solder or a resin.

The above structured SAW filter 10 is limited in being compact-sized, because the SAW filter 10 electrically connects the SAW element 14 to the package 11 by use of a wire in order to seal the embedded SAW element 14, and the metal cap 13 is joined on the upper side of the package 11. Also, the smaller SAW element 14 is, the more complicated it is to manufacture the SAW filter 10, and accordingly manufacturing costs increase.

Various methods using wafer level packaging technology have been under development to achieve a compact-sized SAW device. In particular, a method of implementing an integrally combined device by joining the SAW device and a wafer made of Silicon (Si) has been attempted. However, there are many problems due to the different thermal expansions of the different materials used in the SAW device and the wafer.

SUMMARY OF THE INVENTION

An aspect of the present invention is to solve at least the above problems and/or disadvantages of the related art and to provide at least the advantages described below. Accordingly, an aspect of the present invention is to provide a wafer level package for a SAW (surface acoustic wave) device and a fabrication method thereof.

In order to achieve the above-described aspects of the present invention, there is provided a wafer level package for a surface acoustic wave (SAW) device comprising: a SAW device formed with a SAW element on an upper surface of a device wafer; a cap wafer joined on an upper part of the SAW element; a cavity part housing the SAW element between the cap wafer and the SAW device; a cap pad formed on an upper surface of the cap wafer; and a metal line formed to penetrate through the cap wafer to electrically connect the cap pad and the SAW element, the device wafer and the cap wafer being made of the same materials.

The SAW element further comprises a device pad provided on the upper surface of the device wafer to connect to the SAW device, and a connection pad formed on a lower surface of the cap wafer to connect to the device pad.

The metal line comprises a metal layer applied to an inner circumference of a via-groove which penetrates through the connection pad and the device pad from the upper surface of the cap wafer and is extended to the device wafer, and connected to the cap pad.

The respective lower surface of the cap wafer and upper surface of the cap wafer are faced with a cap sealing line and a device sealing line which are joined to externally seal the cavity part.

In order to achieve the above-described aspects of the present invention, there is provided a fabrication method of a wafer level package for a surface acoustic wave device, comprising: a) forming a connection pad on a lower part of a cap wafer; b) providing a SAW element on an upper surface of a device wafer, and a SAW device having a device pad electrically connected to the SAW element; c) joining the cap wafer to an upper surface of the SAW device, to connect the connection pad and the device pad; and d) forming a cap pad on an upper surface of the cap wafer, and electrically connecting the cap pad to the device pad of the SAW device.

The operation of d) comprises: d1) forming a via-groove penetrating the cap wafer, to expose the device pad ; d2) applying a metal substance to the upper surface of the cap wafer and an internal surface of the via-groove and d3) forming the plurality of cap pads on the cap wafer and a metal line connecting the cap pad and the device pad, by patterning the metal substance applied on the upper surface of the cap wafer.

In the operation of d1), the via-groove is formed by sand-etching or blasting or laser-drilling the upper surface of the cap wafer.

In the operation of d1), the via-groove penetrates through the cap wafer, the connection pad, a joined layer and the device pad, and is extended to the device wafer in a predetermined depth.

In the operation of d3), the metal line is electrically connected to the connection pad, the device pad and the SAW element.

In the operation of c), a cap sealing line formed on the lower surface of the cap wafer is joined with a device sealing line formed on the upper surface of the device wafer.

The cap wafer and the device wafer are made of the same material. Desirably, the cap wafer and the device wafer are made of a Lithium Tantalate (LiTaO$_3$)or a Lithium Niobate (LiNbO$_3$).

In order to achieve the above-described aspects of the present invention, there is provided a wafer level package for a surface acoustic wave (SAW) device comprising: a SAW device formed a SAW element on an upper surface of a device wafer; a packaging cap having: a connection rod penetrating through a cap wafer in order to electrically connect the cap wafer joined to an upper surface of the SAW device, a cap pad formed on an upper surface of the cap wafer, and the SAW element; and a metal seed layer enclosing a side of the connection rod; and a cavity part housing the SAW element between the cap wafer and the SAW device, the device wafer and the cap wafer being made of the same materials.

The packaging cap further comprises a connection pad formed on a lower surface of the cap wafer to connect to the connection rod, and the SAW device further comprises a device pad corresponding to the connection pad and connected to the SAW element.

The respective lower surface of the cap wafer and upper surface of the device wafer are faced with a cap sealing line and a device sealing line which are joined to externally seal the cavity part.

In order to achieve the above-described aspects of the present invention, there is provided a fabrication method of a wafer level package for a surface acoustic wave device, comprising: a) forming a SAW element on a upper surface of a device wafer and forming a SAW device having a device pad electrically connected to the SAW element; b) providing a packaging cap where a cap pad and a connection pad formed on upper and lower surfaces of a cap wafer, respectively electrically connected by a connection rod penetrating through the cap wafer; and c) joining the packaging cap to a upper part of the SAW device to connect the connection pad and the device pad.

The operation of b) comprises: b1) forming a via-groove to a predetermined depth from an upper part of cap wafer; b2) forming a metal seed layer by applying a metal substance on the upper surface of the cap wafer formed with the via-groove; b3) plating the metal substance on the metal seed layer to fill the via-groove; b4) removing a plated layer and the metal seed layer on the cap wafer by flattening the upper surface of the cap wafer; b5) removing a metal seed layer formed on a lower surface of the via-groove by flattening the lower surface of the cap wafer, and exposing the connection rod plated on the via-groove to the lower surface of the cap wafer; b6) forming the cap pad on the upper surface of the cap wafer and connecting the cap pad to the connection rod plated on the via-groove; and b7) forming the connection pad to be connected to the connection rod exposed to the lower surface of the cap wafer.

In the operation of b1), the via-groove is formed by a sand etching or blasting process or a laser drilling process.

The operations of b5) and a b6) are performed by a grinding process and a polishing process, respectively.

In the operation of c), a cap sealing line formed on the lower surface of the cap wafer and a device sealing line formed on the upper part of the device wafer are joined to each other.

The cap wafer and the device wafer are made of the same material. Desirably, the cap wafer and the device wafer are made of Lithium Tantalate (LiTaO$_3$) or Lithium Niobate (LiNbO$_3$).

BRIEF DESCRIPTION OF THE DRAWING FIGURES

The above aspect and other features of the present invention will become more apparent by describing in detail exemplary embodiments thereof with reference to the attached drawing figures, wherein.

Figure 1A:
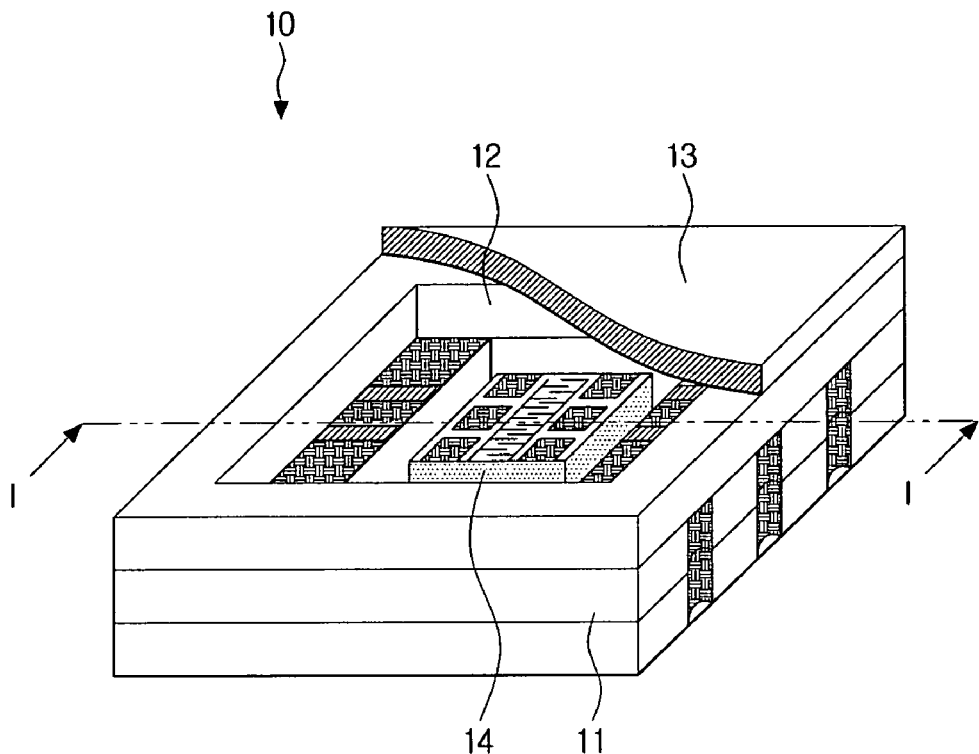
FIGS. 1A and 1B are a perspective view and a sectional view taken along a line I-I of a conventional package for a surface acoustic wave device.
Figure 1B:
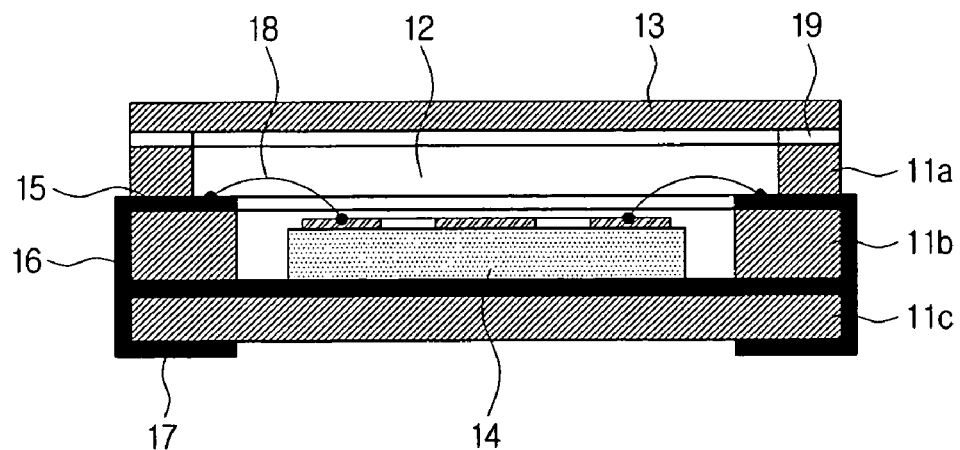
Figure 2:
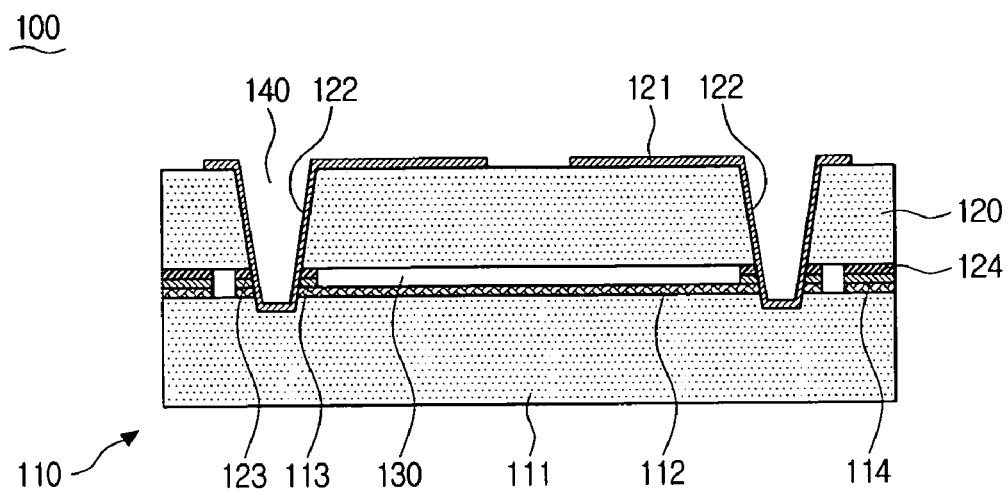
FIG. 2 is a sectional view of wafer level package for a surface acoustic wave device according to an embodiment of the present invention.
Figure 4:
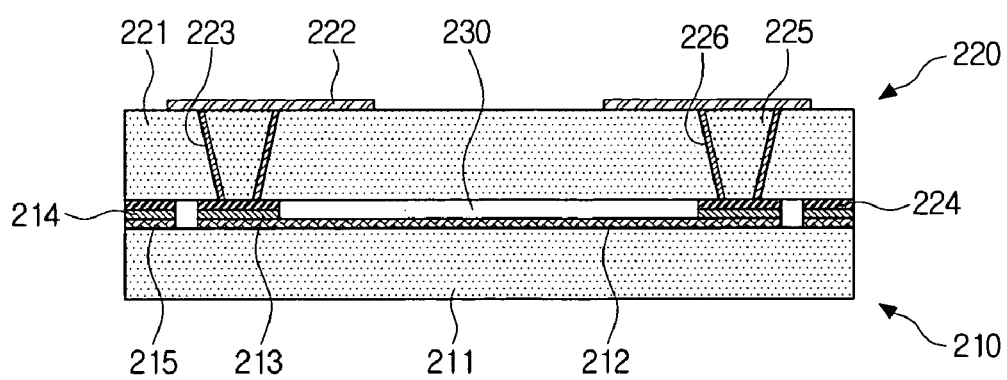
Figure 5A:
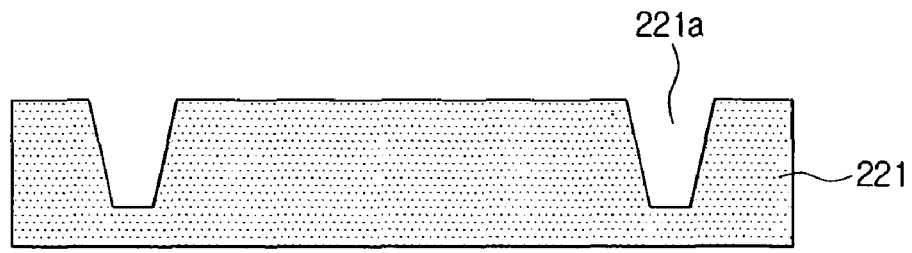
Figure 5B:
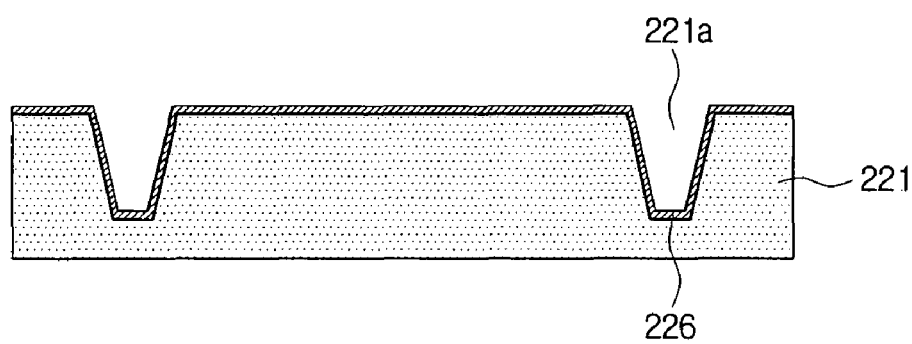
Figure 5C:
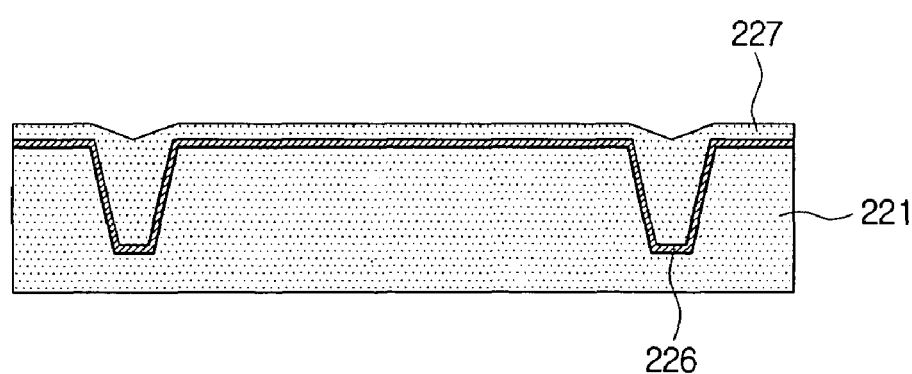
Figure 5D:
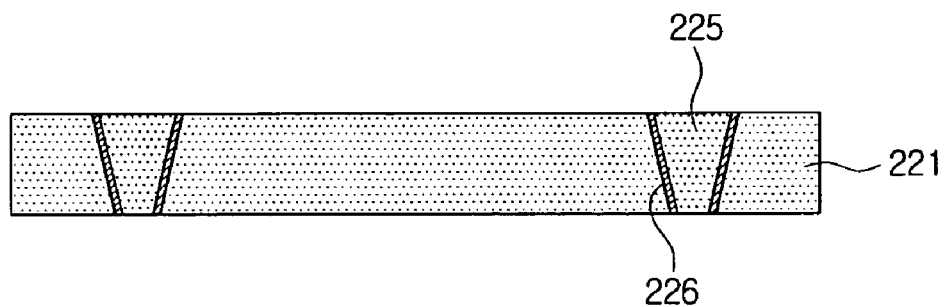
Figure 5E:
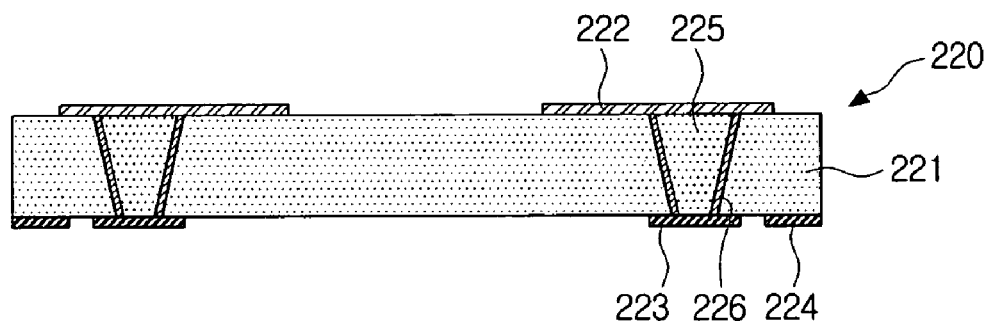
Figure 6:
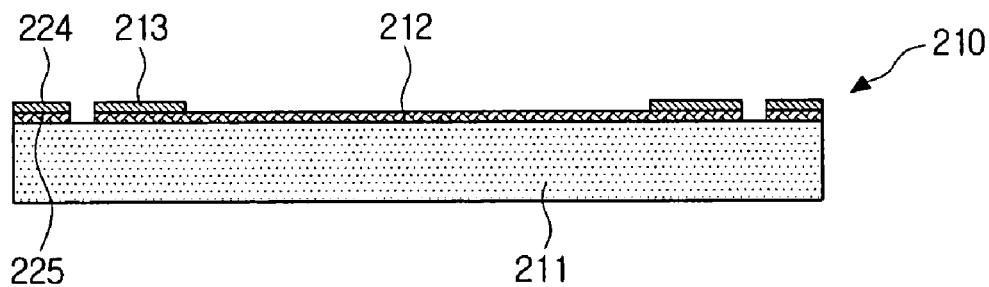

FIGS. 3A through 3D schematically show a sectional view provided to explain the wafer level package for a surface acoustic wave device and a fabrication method thereof illustrated in FIG. 2;

FIG. 4 shows a wafer level package for a surface acoustic wave device according to another embodiment of the present invention; and FIGS. 5A through 6 schematically show the wafer level package for a surface acoustic wave device and a fabrication method thereof illustrated in FIG. 4.

DETAILED DESCRIPTION OF THE EXEMPLARY EMBODIMENTS

Hereinafter, an embodiment of the present invention will be described in detail with reference to the accompanying drawing figures.

In the following description, the same drawing reference numerals are used for the same elements throughout the drawings. The description of a detailed construction and elements are provided to assist in a comprehensive understanding of the invention, and it is apparent that the present invention can be carried out without these details. Also, well-known functions or constructions are not described in detail since they would obscure the invention in unnecessary detail.

Referring to FIG. 2, the wafer level package for a SAW (surface acoustic wave) device 100 according to the embodiment of the present invention includes a SAW device 110 formed with a SAW element 112 on a upper surface of a device wafer 111, a cap wafer 120 joined on a upper part of the SAW device 110, a cavity part 130 housing the SAW element 112 between the cap wafer 120 and the SAW device 110, a cap pad 121 formed on an upper surface of the cap wafer 120, and a metal line 122 formed to penetrate through the cap wafer 120 to electrically connect the cap pad 121 and the SAW element 112.

The SAW element 112 may be formed on a bottom part of the cavity part 130, that is, the upper surface of the device wafer 111, while a surface with an InterDigital Transducer on it is put faceup. The SAW element 112 is evaporated with a metal substance on the device wafer 111 in a predetermined pattern. A device pad 113 and a device sealing line 114 are formed on an upper part of the SAW element 122 at the same height. The device pad 113 and the device sealing line 114 may be made of the same metal material. The SAW element 112, the device pad 113 and the device sealing line 114 may have Gold (Au), Aluminum (Al), Copper (Cu), Titanium (Ti), Chrome (Cr), Tantalum (Ta), or Nickel (Ni) as a main substance. The number of device pads 113 is one or more, and the device sealing line 114 is formed in the vicinity of the cavity part of the device wafer 111.

The cap wafer 120 is made of the same material as the device wafer 111, and may be formed of a Lithium Tantalate (LiTaO$_3$) or a Lithium Niobate (LiNbO$_3$). Likewise, if the cap wafer 120 and the device wafer 111 are formed of the same material, coefficients of thermal expansion between the SAW device 110 and the cap wafer 120 are equal and package damage is prevented in the process of fabricating a wafer package.

A lower surface of the cap wafer 120 is provided with a plurality of connection pads 123 corresponding to the device pad 113. The connection pads 123 are joined to the device pad 113, to electrically connect thereto. The lower surface of the cap wafer 120 is provided with a cap sealing line 124 corresponding to the device pad 113. The cap sealing line 124 is joined to the device sealing line 114, at the same time when joined to the connection pads 123, so that the cavity part 130 can be externally sealed.

One or more cap pads 121 are provided on the upper surface of the cap wafer 120. The metal line 122 electrically connects the cap pad 121 and the SAW element 112, and is formed by applying a metal substance on an internal surface of a via-groove 140 extending through the cap wafer 120 to the device wafer 111.

The via-groove 140 is formed by penetrating through the lower surface from the upper surface of cap wafer 120, and penetrates further through a connection part between the connection pads 123 and the device pad of the SAW element 112, to extend into the device wafer 111 to a predetermined depth. Likewise, the metal line 122 formed by applying the metal material on the via-groove 140 stretching from the upper surface of the cap wafer 120 to the device wafer 111 extends to a predetermined depth. The metal line 122 is simultaneously connected to the connection pads 123, the device pad 113 and the SAW element 112.

The metal line 122 is formed by applying the metal substance on the above via-groove 140, and stably connects to the connection pads 123, the device pad 113, and the SAW element 112, to improve the electrical connection.

Hereinafter, a fabrication method of a wafer level package for a SAW (surface acoustic wave) device will be described.

Figure 3A:
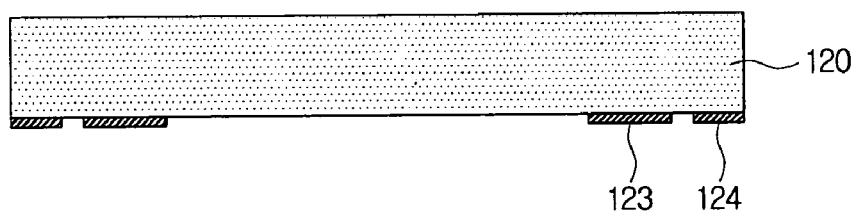
Figure 3B:
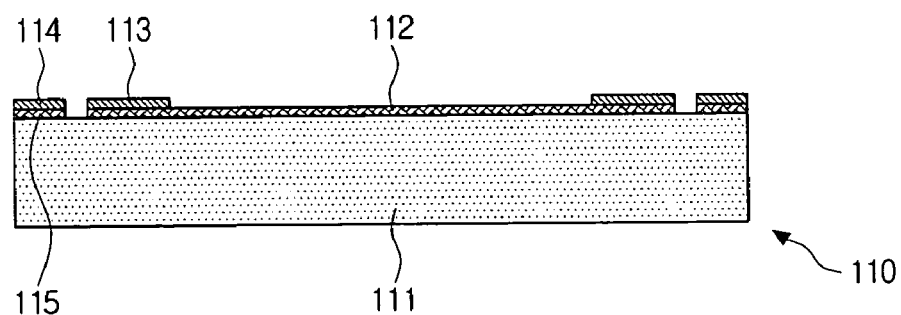

As illustrated in FIG. 3A, a plurality of connection pads 123 and a cap sealing line 124 are formed on a lower surface of a cap wafer 120. The plurality of connection pads 123 and the cap sealing line 124 are formed at the same time, by applying a metal material and mask-patterning As illustrated in FIG. 3B, a SAW device 110 is prepared. The SAW device 110 is formed by patterning a SAW element 112 on an upper surface of a device wafer 111 with the metal material. A plurality of device pads 113 are formed on a connection part of the SAW element 112, that is, an upper surface of the SAW element 112. Just like the device pads 113, a device sealing line 114 is patterned with the metal material. The device sealing line 114 is formed on a supporting layer 115 left from patterning the SAW element 112.

Figure 3C:
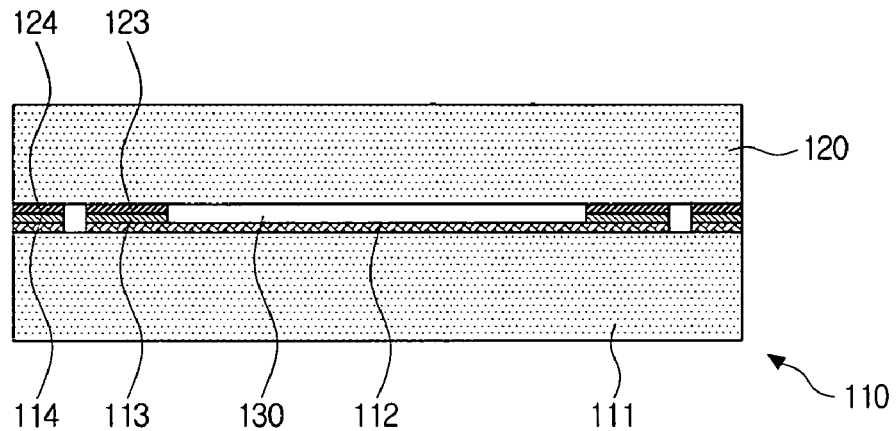

As illustrated in FIG. 3C, an upper part of the SAW device 110 is joined with the cap wafer 120 having the connection pads 123 and the cap sealing line 124. The cap sealing line 124 and the device sealing line 114 are joined. A cavity part 130 is provided between the cap wafer 120 and the SAW device 110. The connection pads 123 are joined to the device pads 113.

Figure 3D:
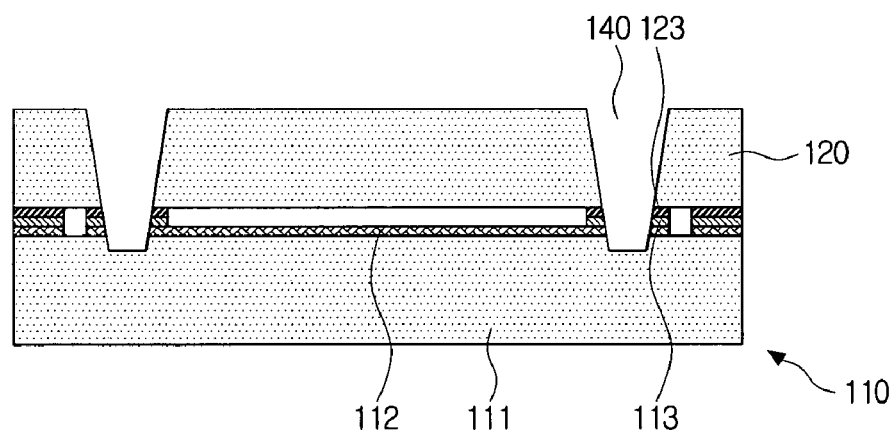

As illustrated in FIG. 3D, a plurality of via-grooves is formed to extend from an upper surface of the cap wafer 120 to the device wafer 111 to a predetermined depth. The via-grooves 140 are formed by a sand-etching or blasting process or a laser-drilling process. The via-grooves 140 penetrate through the cap wafer 120, and further through the connection pads 123, the device pads 113 and the SAW element 112, to extend to a predetermined depth from the upper surface of the device wafer 111.

If the via-grooves are formed, as illustrated in FIG. 2, the metal material is applied to cover the upper surface of the cap wafer 120 and the via-grooves 140 and is patterned, so that the cap pad 121 and the metal line 122 are formed. Likewise, it is easier to electrically connect the cap pad 121 and the SAW element 112 and achieve improvements in electrical parameters, by applying the metal material on the formed via-grooves 140 and forming the metal line 122. The process is relatively simple by joining the cap wafer 120 to the SAW device 110 and forming the via-grooves 140, to form the metal line 122. The metal line 122 and the cap pad 121 may be made of a Gold (Au), a Copper (Cu) or an Aluminum (Al) material.

Referring to FIG. 4, a wafer level package for a surface acoustic wave device according to another embodiment of the present invention includes a SAW device 210 and a packaging cap 220 joined to an upper part of the SAW device 210.

The SAW device 210 is provided with a SAW element 212 on an upper surface of a device wafer 211. A device pad 213 is provided to connect to the SAW element 212. A device sealing line 214 is formed on the upper surface of the device wafer 211. The device sealing line 214 is disposed on a supporting layer 215 on the upper surface of the device wafer 211. The device sealing line 214 and the device pad 213 may be made of a metal material, and be formed at the same time. The device wafer 211 may be made of a piezoelectric material and desirably formed of a Lithium Tantalate (LiTaO$_3$) or a Lithium Niobate (LiNbO$_3$).

The packaging cap 220 includes a cap wafer 221, a cap pad provided on a upper surface of the cap wafer 221, a connection pad 223 formed on a lower surface of the cap wafer 221, a cap sealing line 224 formed on the lower surface of the cap wafer 221, a connection rod 225 formed by penetrating through the cap wafer, and a metal seed layer 226.

The cap wafer 221 is formed of the same material as that used for the device wafer 211. The cap wafer 221 is joined to the upper part of the SAW device 210. The packaging cap 220 and the SAW device 210 are joined to form a cavity part 230 therebetween. The cap pad 222 is made of the metal material and one or more cap pads are formed on the upper surface of the cap wafer 221. The number of the connection pads 223 corresponds to that of the device pads 213 and formed on corresponding places to the device pads 213. The cap sealing line 224 is formed on the lower surface of the cap wafer 221, corresponding to the device sealing line 214. The cap sealing line 224 may be formed together when the connection pads 213 are patterned with the metal material. The cap sealing line 224 is joined to the device sealing line 214, to seal the cavity part 230.

The connection rod 225 is formed by filling the metal material in a via-groove formed by penetrating through the cap wafer 211, to electrically connect the cap pads 222 and the connection pads 223. The connection rod 225 has an upper part directly connected to the cap pads 222 and a lower part electrically connected to the connection pads 213. The metal seed layer 226 is formed by applying the metal material on an internal circumference of the via-groove.

According to the above structure, the cap wafer 221 may be made of the same material as that used for the device wafer 211, to prevent any possible damage or cracks therebetween caused by a thermal expansion mismatch in fabricating a package. Accordingly, with such a safe method of fabricating the package, it is possible to fabricate a package for the SAW device, to achieve a small-size and high-performance SAW device.

Hereinafter, according to another embodiment of the above-structured present invention, a fabrication method of a wafer level package for a SAW (surface acoustic wave) device will be described.

Referring to FIG. 5A, a via-groove 221a is formed to a predetermined depth from an upper surface of a cap wafer 221. The via-groove 221a is formed to create a via-hole later. The via-groove 221a may be formed by a sand-etching or blasting process or a laser-drilling process.

As illustrated in FIG. 5B, a metal seed layer 226 is formed by applying a metal material on an inner surface of the via-groove 221a and the upper surface of the cap wafer 221.

Metal materials forming the metal seed layer 226 include Chrome (Cr), Gold (Au) and Copper (Cu) as a main substance.

As illustrated in 5C, a plated layer 227 is formed to a predetermined thickness by electrically plating a metal material, desirably Cu, on an upper part of the metal seed layer 226.

As illustrated in 5D, the upper surface and a lower surface of the cap wafer 221 are flattened by a grinding process and a polishing process. The metal seed layer and the plated layer applied with the metal material on the upper surface of the cap wafer 221 are removed and the cap wafer 221 is exposed. The plated material filled in the via-groove, that is, the abovementioned connection rod 225, is left.

The lower surface of the cap wafer 221 is removed with the metal seed layer 226 formed on a bottom of the via-groove and ground, in order for the connection rod 225 to be exposed externally from the cap wafer 221.

As illustrated in FIG. 5E, a cap pad 222 on the upper surface of the cap wafer 221 is patterned with the metal material. A connection pad and a cap sealing line 224 on the lower surface of the cap wafer 221 are patterned with the metal material. The connection pads 223 electrically connect to the connection rod 225 formed on the via-groove.

A packaging cap 220 is prepared by the abovementioned method and a SAW device 210 is provided, as illustrated in FIG. 6. The SAW device 210 is formed with a SAW element 212 and supporting pad 225 by patterning the metal material on a device wafer 211. Device pads 213 are mask-patterned to connect to the device element 212. The plurality of device pads 213 are formed in places where the device pads 213 face the connection pads 223. A device sealing line 224 is formed together when the device pads 213 are patterned with the metal material.

As abovementioned, the SAW device 210 is provided, and the packaging cap 220 is joined to an upper surface of the SAW device 210. The cap sealing line 224 and the device sealing line are joined, and a cavity part 230 is formed therebetween, as illustrated in FIG. 4.

A wafer level package for a SAW (surface acoustic wave) device manufactured in the abovementioned method has a cap wafer 211 and a device wafer 221 made of the same material, and the cap wafer 211 and the device wafer 221 have the same coefficient of thermal expansion. Accordingly, damage or breakage of the SAW device 210 or packaging cap 220 due to thermal expansion and thermal shrinkage are prevented. It is enabled to mass-produce the SAW device 210 in a small size using a fabrication method of a wafer level package, to achieve a small-sized and a light device, and reduce manufacturing costs.

As abovementioned, according to the inventive wafer level package for a SAW (surface acoustic wave) device and fabrication method thereof of the present invention, a SAW device wafer and a packaging cap are formed of the same material and joined. Accordingly, the SAW device wafer and the packaging cap have the same coefficient of thermal expansion and damage or breakage of a package due to thermal expansion and thermal shrinkage is prevented. It is enabled to fabricate a wafer level package for a SAW device, to achieve a small-sized and light product and simplify manufacturing, to reduce manufacturing costs.

While the invention has been shown and described with reference to certain embodiments thereof, it will be understood by those skilled in the art that various changes in form and details may be made therein without departing from the spirit and scope of the invention as defined by the appended claims.

What is claimed is:

1. A wafer level package for a surface acoustic wave (SAW) device comprising:
   a SAW device formed with a SAW element on an upper surface of a device wafer;
   a cap wafer joined on an upper part of the SAW element;
   a cavity part housing the SAW element between the cap wafer and the SAW device;
   a cap pad formed on an upper surface of the cap wafer; and
   a metal line formed in a via-groove to penetrate through the cap wafer to electrically connect the cap pad and the SAW element;
   wherein the device wafer and the cap wafer are made of the same materials, and
   wherein the via-groove penetrates through the cap wafer and the SAW element and is formed to extend into the device wafer to a predetermined depth without completely penetrating through the device wafer.

2. The wafer level package of claim 1, wherein the SAW element further comprises a device pad provided on the upper surface of the device wafer to connect to the SAW device, and a connection pad formed on a lower surface of the cap wafer to connect to the device pad.

3. The wafer level package of claim 2, wherein the via groove penetrates through the connection pad and the device pad from the upper surface of the cap wafer and is extended to the device wafer, and the metal line comprises a metal layer applied to an inner circumference of the via-groove and connected to the cap pad.

4. The wafer level package of claim 2, wherein the respective lower surface of the cap wafer and upper surface of the device wafer are faced with a cap sealing line and a device sealing line which are joined to externally seal the cavity part.

5. The wafer level package of claim 1, wherein the cap wafer and the device wafer are made of a Lithium Tantalate (LiTaO3) or a Lithium Niobate (LiNbO3).

6. A fabrication method of a wafer level package for a surface acoustic wave device, comprising:
   a) forming a connection pad on a lower part of a cap wafer;
   b) providing a SAW element on an upper surface of a device wafer, and a SAW device having a device pad electrically connected to the SAW element;
   c) joining the cap wafer to an upper surface of the SAW device, to connect the connection pad and the device pad; and
   d) forming a cap pad on an upper surface of the cap wafer, and electrically connecting the cap pad to the device pad of the SAW device, wherein the operation of d) comprises:
      d1) forming a via-groove penetrating the cap wafer, to expose the device pad;
      d2) applying the upper surface of the cap wafer and an internal surface of the via-groove with a metal substance; and
      d3) forming the plurality of cap pads on the cap wafer and a metal line connecting the cap pad and the device pad, by patterning the metal substance applied on the upper surface of the cap wafer, and
   wherein in the operation of d1), the via-groove penetrates through the cap wafer, the connection pad, a joined layer, and-the device pad, and the SAW element and is formed to extend into the device wafer to a predetermined depth without completely penetrating through the device wafer.

7. The fabrication method of claim 6, wherein in the operation of d1), the via-groove is formed by sand-etching or blasting or blasting or laser-drilling processing the upper surface of the cap wafer.

8. The fabrication method of claim 6, wherein in the operation of d3), the metal line is electrically connected to the connection pad, the device pad and the SAW element.

9. The fabrication method of claim 6, wherein in the operation of c), a cap sealing line formed on the lower surface of the cap wafer is joined with a device sealing line formed on the upper surface of the device wafer.

10. The fabrication method of claim 6, wherein the cap wafer and the device wafer are made of the same material.

11. The fabrication method of claim 10, wherein the cap wafer and the device wafer are made of a Lithium Tantalate ($LiTaO_3$) or a Lithium Niobate ($LiNbO_3$).

* * * * *